United States Patent
Dam et al.

[11] Patent Number: 5,218,259
[45] Date of Patent: Jun. 8, 1993

[54] COATING SURROUNDING A PIEZOELECTRIC SOLID STATE MOTOR STACK

[75] Inventors: Chuong Q. Dam, Peoria; Kurtis C. Kelley, Washington, both of Ill.

[73] Assignee: Caterpillar Inc., Peoria, Ill.

[21] Appl. No.: 836,476

[22] Filed: Feb. 18, 1992

[51] Int. Cl.$^5$ .......................................... H01L 41/08
[52] U.S. Cl. ................... 310/328; 310/344; 310/346
[58] Field of Search ............... 310/328, 325, 340, 344, 310/346, 365, 366, 342

[56] References Cited

U.S. PATENT DOCUMENTS

| | | | |
|---|---|---|---|
| 3,351,787 | 11/1967 | Kistler | 310/329 |
| 3,396,285 | 8/1968 | Michenko | 310/325 |
| 3,495,104 | 2/1970 | Burgo et al. | 310/325 |
| 3,501,099 | 3/1970 | Benson | 239/585 |
| 3,635,016 | 1/1972 | Benson | 60/23.6 |
| 3,683,211 | 8/1972 | Perlman | 310/8.2 |
| 4,011,474 | 3/1977 | O'Neill | 310/8.7 |
| 4,038,570 | 7/1977 | Durley, III | 310/8.1 |
| 4,051,396 | 9/1977 | Berlincourt | 310/340 |
| 4,193,009 | 3/1980 | Durley, III | 310/323 |
| 4,382,243 | 5/1983 | Babitzka | 335/219 |
| 4,553,059 | 11/1985 | Abe et al. | 310/328 |

FOREIGN PATENT DOCUMENTS

| | | | |
|---|---|---|---|
| 0319038A2 | 7/1989 | European Pat. Off. | |
| 60-121784 | 6/1985 | Japan | 310/366 |
| 63-88875 | 4/1988 | Japan | 310/366 |
| 0250678 | 10/1990 | Japan | 310/328 |

OTHER PUBLICATIONS

Dow Corning, New Product Information, X3-6632 Thermally Conductive Silicone Adhesive, Midland, Mich., 48686-0994, Dated: Aug. 1, 1989.

*Primary Examiner*—Mark O. Budd
*Attorney, Agent, or Firm*—David M. Masterson

[57] ABSTRACT

A solid state motor includes a plurality of piezoelectric elements assembled in a stack. Each element has two opposing planar surfaces. A plurality of electrodes each has a planar section contacting the planar surfaces of two adjacent elements in the stack. A silicone adhesive is adapted to adhere to the piezoelectric elements. A plurality of alumina particles are disposed in the silicone adhesive. A protective housing cylindrically encases the combination of the stack, electrodes, and silicone adhesive.

8 Claims, 4 Drawing Sheets

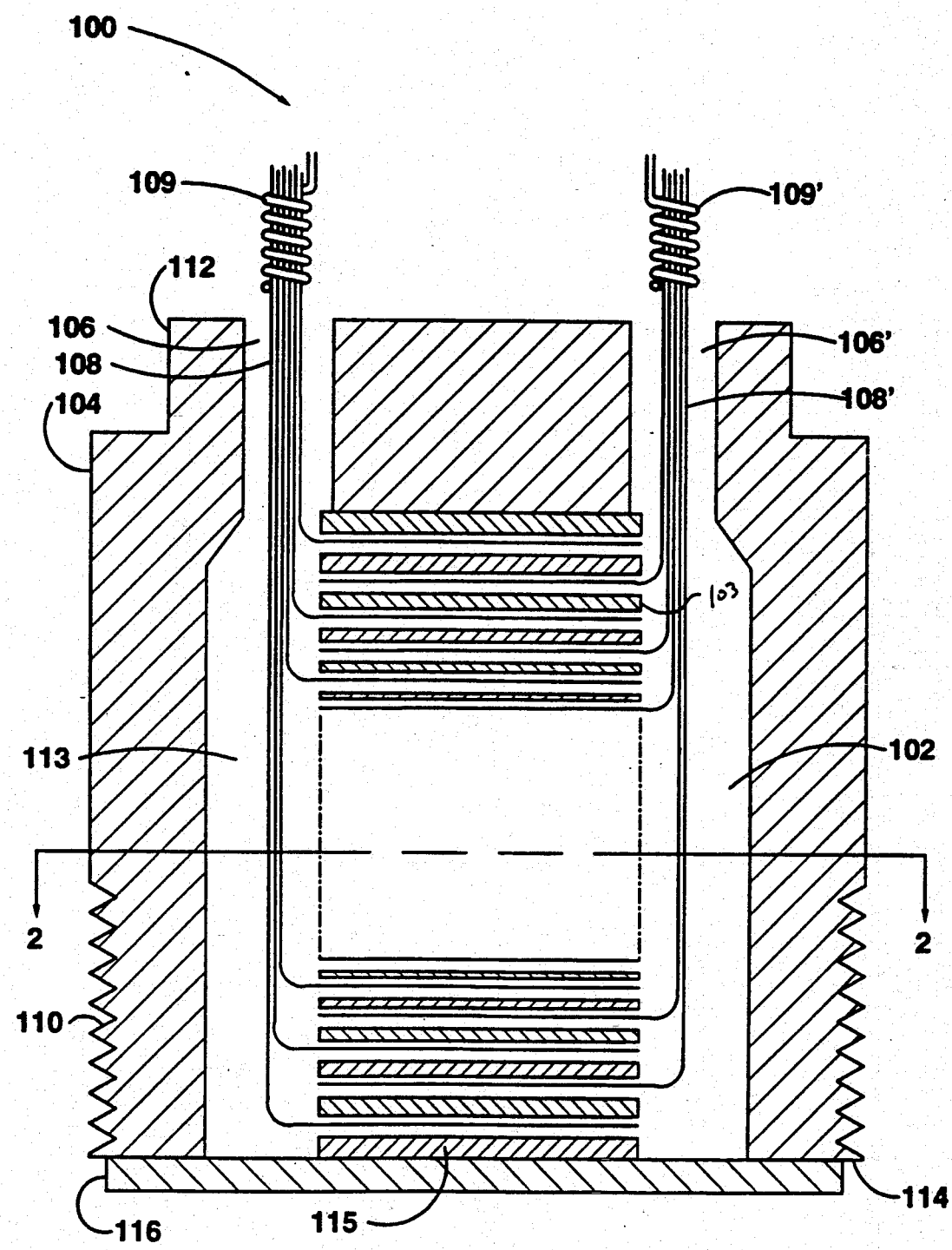
Fig_1_

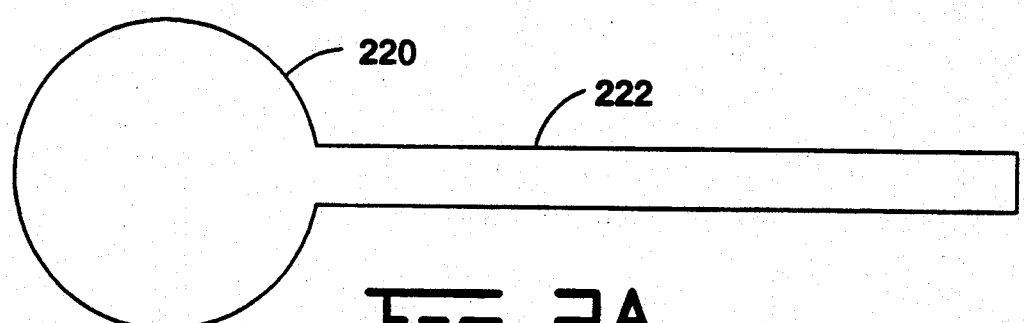
Fig_2A_
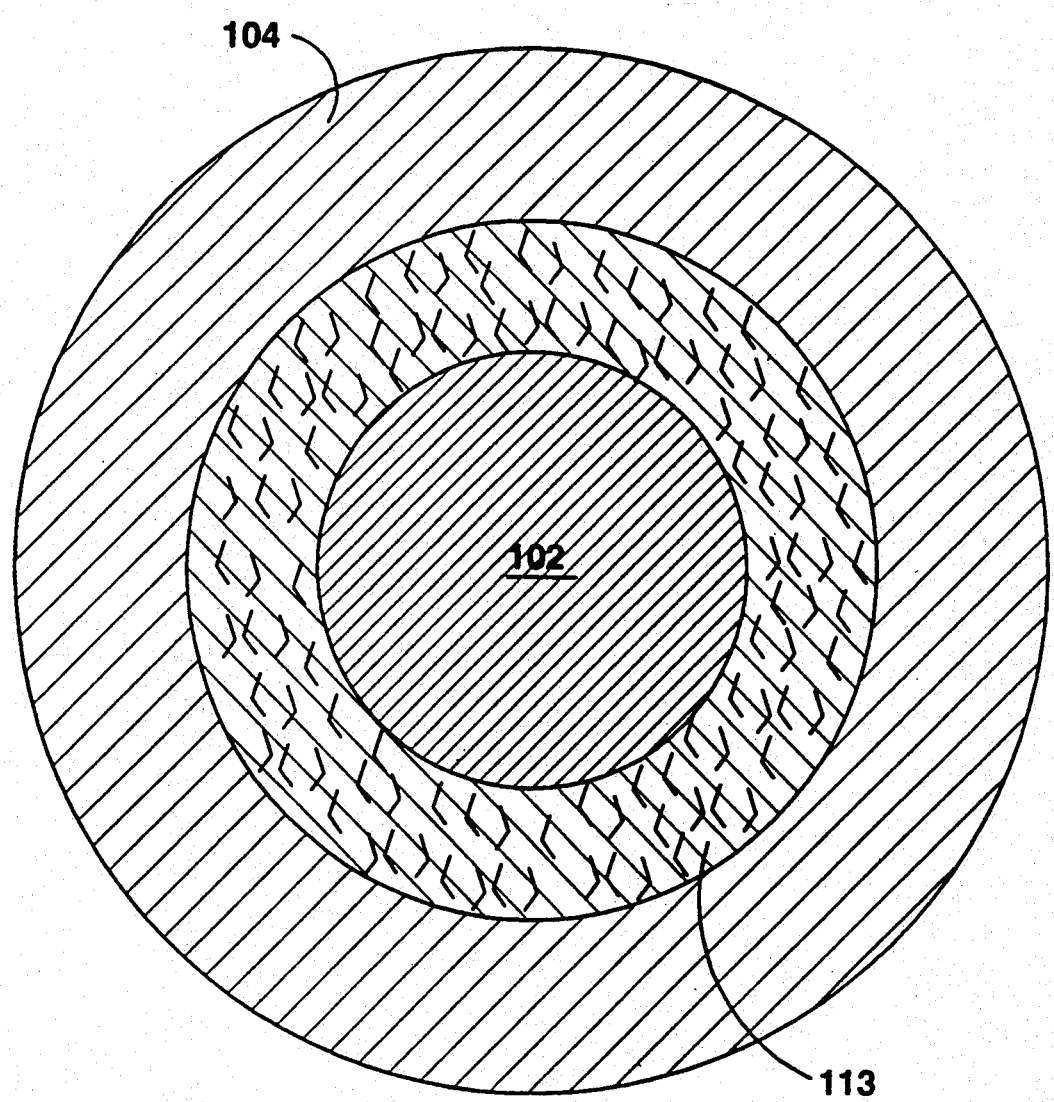
Fig_2B_

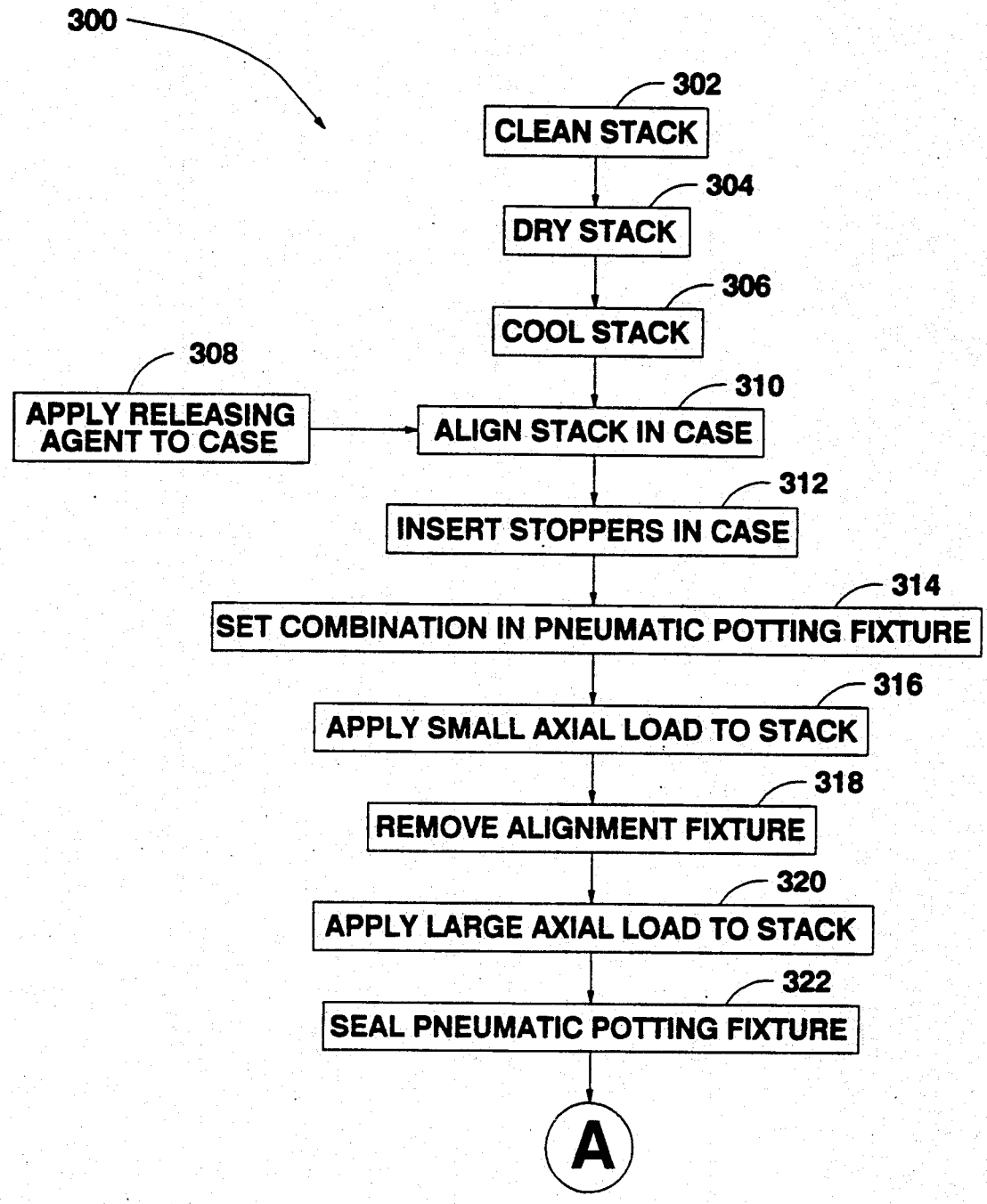
Fig_3A_

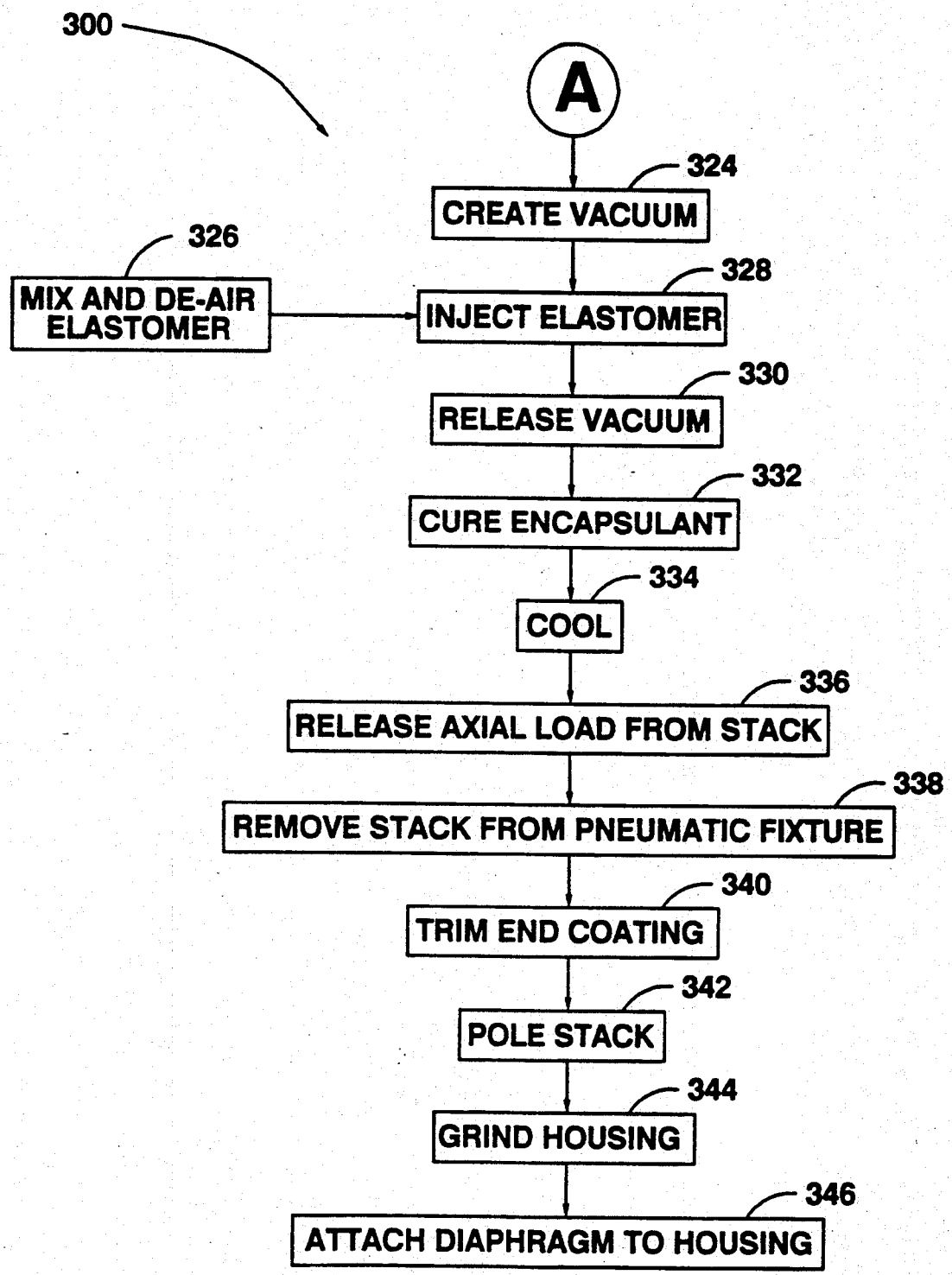
Fig_3B_

COATING SURROUNDING A PIEZOELECTRIC SOLID STATE MOTOR STACK

TECHNICAL FIELD

The field of the invention relates generally to an encapsulation structure for solid state motor actuators, and more particularly to a process for encapsulating piezoelectric solid state motor stacks.

BACKGROUND ART

Commercially manufactured solid state motor stacks, or actuators, are produced using piezoelectric discs interleaved with metal foil electrodes. Application of electrical potential applied to alternately biased electrodes causes each of the piezoelectric discs to expand or axially distort. The additive deflection of the stacked discs is typically amplified by hydraulics to effectuate useful actuation.

An example of a conventional electromechanical actuator having an active element of electroexpansive material is found in U.S. Pat. Nos. 3,501,099 and 3,635,016 to Glendon M. Benson. Benson's patents disclose both an actuation amplification structure and a method for manufacturing piezoelectric stacks. Sheets of ceramic material are rolled, compacted and punched into ceramic discs. After a cleaning process, the discs are stacked with alternate sets of continuous disc electrodes disposed between the ceramic discs. The stacks undergo a pressurized cold-welding process, followed by an elevated temperature and pressure bonding process after common electrodes are connected to the two electrode groups. The stacks are poled by application of a DC voltage and then encapsulated with a plastic insulative cover prior to final mounting within a transducer housing.

Various environmental design considerations are important in piezoelectric stack manufacturing. Device operating temperature ranges and external mechanical stresses are the most serious of these factors.

Conventional stacks are limited to a maximum operating temperature of about 75° Celsius, measured at the outside of the stack housing. Heat generated by the stack itself is compounded by the ambient temperature. For example, one application of the stack may be to actuate the valves on an engine. Extreme heat generated by the engine upon which the housed stack is typically mounted typically results. Stack temperatures can reach upward of 40°-50° C. above the measured engine temperature.

On the other hand, structural defects typically lead to conventional stack failure due to shear and torsional stresses applied to the stack during operation and/or installation. Structural stack failure is most commonly attributed to fatigue cracking of the ceramic discs. Separation between disks/electrodes is also a frequent problem.

Piezoelectric stack insulation has been introduced between the disk/electrode stack and the housing in an attempt to minimize some of the above mentioned problems.

U.S. Pat. No. 4,011,474 to Cormac G. O'Neill discloses several methods for improving stack insulation to avoid operation breakdowns. Arc-over is allegedly avoided by maintaining contact between the piezoelectric stack and the insulating material. In a first embodiment, O'Neill teaches introducing a pressurized insulating fluid such as oil, into the housing of a piezoelectric stack. The fluid is pressurized so as to maintain contact between the fluid and the stack during radial shrinkage, or axial expansion, upon the application of an applied voltage.

In a second embodiment, O'Neill applies a solid polyurethane coating to the stack. The coating is kept in contact with the stack by a pressurized insulating fluid to prevent separation during operation and arc-over associated therewith.

A third O'Neill embodiment maintains contact between the stack and a solid insulating coating by winding a filament or tape around the coated stack. The tape is wound around the coating to preload the coating to prevent separation of the coating from the stack. The winding of the tape is spaced to allow for expansion of the polyurethane coating during operation of the stack.

The present invention constitutes an improvement over conventional encapsulation technology. Benefits, such as increased stack operational temperature range, endurance, output, and lifetime, are achieved by the present invention.

DISCLOSURE OF THE INVENTION

In one aspect of the present invention, a piezoelectric solid state motor is provided. The solid state motor includes a plurality of piezoelectric elements assembled in a stack. Each element has two opposing planar surfaces. A plurality of electrodes each has a planar section contacting the planar surfaces of two adjacent elements in the stack. A silicone adhesive is adapted to adhere to the piezoelectric elements. A plurality of alumina particles are disposed in the silicone adhesive. A protective housing cylindrically encases the combination of the stack, electrodes, and silicone adhesive.

In another aspect of the present invention, a method for encapsulating a piezoelectric solid state motor is provided. The method includes the following steps. Encapsulating the stack with a low viscosity silicone adhesive having thermal properties. Curing the silicone adhesive at a first temperature for a first predetermined amount of time, setting the silicone adhesive. And thereafter curing the silicone adhesive at a second temperature for a second predetermined amount of time, further establishing adhesion between the piezoelectric elements and the silicone adhesive.

BRIEF DESCRIPTION OF THE DRAWINGS

For a better understanding of the present invention, reference may be made to the accompanying drawings, in which:

FIG. 1 shows a side-sectional view of a housed, encapsulated piezoelectric solid state motor stack in connection with the present invention;

FIG. 2A shows an electrode with a planar section and an elongated section;

FIG. 2B shows a top-sectional view of the housed piezoelectric stack of FIG. 1 taken through line A—A; and FIGS. 3A-3B are flow charts of the basic steps in a method for applying an elastomer in the encapsulation of a piezoelectric stack in connection with the present invention.

BEST MODE FOR CARRYING OUT THE INVENTION

Broadly, the present method for encapsulating piezoelectric stacks is designed for an automated manufacturing process to yield high-quality, high-durability solid state motor stacks. The piezoelectric encapsulation steps of the present process have refined the technology employing careful cleaning and inspection operations which result in stacks with fast responses and great driving forces.

It should be understood that the present invention is directed to a piezoelectric solid state motor stack encapsulation structure and the method of encapsulating the stack structure. However, the terms solid state motor stack and electroexpansive actuator, for example, are synonymous. Throughout this discussion, the piezoelectric solid state motor stacks will be common referred to as "stacks".

The present invention not only overcomes the deficiencies of conventional technologies, as cited above, but also provides the following features and advantages.

FIG. 1 shows a housed solid state motor stack 100, in conjunction with the present invention. An electrode/ceramic element stack 102 is centered in a housing 104. The stack 102 includes a plurality of piezoelectric elements 103. The elements 103 may assume a variety of geometrical shapes. In the preferred embodiment, the elements 103 have substantially circular geometries. Hence, the elements 103 are referred to as discs. Preferably, each disc has two opposing surfaces formed substantially paralleled to one another. The discs are alternately interleaved with two sets of electrodes 108,108'.

The basic structure of each electrode 108,108' will be discusses with reference to FIG. 2A. Each individual electrode 108,108' includes a planar section 220 and an elongated section 222. The planar section 20 of each electrode is adapted to contact a substantial portion of the planar surfaces of two adjacent discs.

The electrodes 108,108' are cut or stamped from metal foil using techniques well known in the art. The electrodes may be formed of copper alloys such as brass, or their known equivalents.

The housing 104 may be formed of hardened steel and is cylindrical in shape with a hollow cylindrical cavity for housing the stack. Two throughports 106 are bored in the top end of the housing 104 to permit the electrodes 108,108' to exit the housing. Each of the electrodes are bundled together by connectors 109,109'.

The housing 104 also includes a set of threads 110 which are used to attach the stack and housing to an engine head, for example. Housing 104 has a plateau region 112. As viewed from the top of FIG. 1, the plateau region 112 has a hexagonal cross section. This hexagonal shape is not shown in the figure, but it is used for tightening and loosening the piezoelectric solid state motor housing on the engine head.

A silicone encapsulant is injected to fill the cavities between the stack and the housing, as well as the gaps between adjacent electrodes. Finally, an end surface 114 of the housing 104 and the exposed surface of a last ceramic element 115 must be simultaneously ground to facilitate proper alignment of a diaphragm 116 to the end of the stack housing 104. The diaphragm 116 may then be laser-welded to the surface 114. This permits the end of the stack (i.e., the end surface of the element 115) to be in contact with the diaphragm 116.

The diaphragm 116 is preferably made of stainless steel with thickness of about 0.1 mm. The steel diaphragm functions to protect the stack from external contaminates In addition, the diaphragm prevents the electrode/element stack from rotating within the housing, but since it is thin and flexible, it allows the stack to move axially with little restraint. The diaphragm and the housing have a preferred hardness of about 30 Rockwell C.

A piston is usually abutted against the diaphragm 116 when the stack is installed on an engine head. During installation, the stack is screwed onto the engine head and the diaphragm 116 transfers stresses to the housing. If no diaphragm were present, the friction between the end ceramic element and the piston would cause the stack to rotate. Rotation of the stack would in turn cause the elements to shear, and separate, and the silicone encapsulant would rupture. Such structural defects would detrimentally affect stack operation.

The section of the housing labeled 118 provides a fixed perch against which the stack is seated. Upon application of a driving voltage of about 1000 V to the electrodes 108,108', the stack will expand in the axial direction against the fixed perch 118, thus causing the diaphragm 116 to move outward thereby producing actuation. Therefore, nearly all axial displacement occurs against the diaphragm 116; almost no axial displacement takes place at the end adjacent the section 118.

FIG. 2B is a cross sectional view taken through line A—A of the piezoelectric solid state motor stack and housing of FIG. 1. The silicone adhesive is shown sandwiched between the stack and the housing. In the preferred embodiment the silicone adhesive is produced by Dow Corning as product number Q3-6632. Advantageously, the silicone adhesive has a low viscosity providing for the adhesive to flow easily into the crevices found in the stack and around the intricate configuration of the electrode assuring complete encapsulation of the stack. The viscosity of the silicone adhesive at 25° C. is 5700 cps and the specific gravity is 2.14. The silicone adhesive comprises a plurality of aluminum oxide (alumina) particles. The alumina particles have a high thermal conductivity characteristics thereby enhancing the thermoconductivity of the encapsulant. Advantageously, the grain size of the alumina particles are substantially the same as the grain size of the piezoelectric material. For example, the grain size of an alumina particle is approximately 1-5 microns and the grain size of the piezoelectric material is 4-5 microns. Therefore the alumina particles make good physical contact with the piezoelectric material thereby conducting much of the heat generated by the stack to the inside of the housing wall where the heat is radiated and enhancing the adhesion of the encapsulant to the piezoelectric material.

A generalized stack encapsulation process 300 is shown in FIGS. 3A & 3B. As shown in block 302 the stack undergoes a cleaning process. In one embodiment, excess gloss and contaminants are removed from the exterior of the assembled stack by a conventional grit blasting technique. The stack is ultrasonically cleaned in a methanol bath. The clean stack is then heat dried at block 304. The heating process removes volatile contaminants. The heating process consists of heating the stack at a temperature of 100° C. for a period of 2 hours in a desiccator, such as a vacuum oven using approximately −98 kPa pressure. The stack is then cooled at room temperature, as indicated at block 306.

Subsequent to block 310, a releasing agent is applied to the inside walls of the housing. The releasing agent inhibits the silicone encapsulant from adhering to the inner walls of the housing. Thus, the releasing agent allows the encapsulant to move with the stack when actuated. Further, the releasing agent allows the encapsulant to expand/contract as the temperature changes, thereby avoiding damage to the encapsulant. In the preferred embodiment, the releasing agent is a flourocarbon suspended release agent produced by Miller-Stepherson as Part No. MS-145.

The stack is then aligned in the housing by a modified alignment fixture at block 310. The alignment fixture should include a cylindrical case including a bottom-/end section. As shown in FIG. 1, one end of the actuator has two openings to permit the electrical leads to pass therethrough. In addition, the inner diameter of the alignment fixture case should be slightly larger than the outside diameter of the stack in order to permit proper encapsulation. Stoppers must then be inserted in the holes at the base of the alignment fixture to seal around the electrical leads, as shown by block 312. Please note that the composition of the alignment fixture case and port stoppers is not crucial to the invention. However, their composition must not be such that contamination of the stack or chemical reactions occur therewith.

In block 314, the prepared alignment fixture is then positioned in a pneumatic potting fixture located in a vacuum chamber. A small axial load is then applied to the stack by the pneumatic potting fixture so that the alignment fixture may be removed. The small axial load is in the force range of about 445-1112.5 Newtons.

After the alignment fixture is removed a large axial load is applied to the stack, in block 320. The load used to compress the stack allows the brass electrodes to form to the irregular surfaces of the disc. Thus, essentially few spaces are formed between a succession of discs thereby increasing stiffness. In the preferred embodiment the force is approximately equal to 8900 Newtons. The chamber is then sealed as shown in block 322. After which a vacuum is created in the chamber shown by block 324. The vacuum draws out a sufficient volume of air so that the elastomer will fill the remaining voids in the stack when the vacuum is released. Preferably, the vacuum is applied at $-100$ kPa.

The application of the adhesive will now be described in further detail. The silicone adhesive is supplied from the manufacturer as A and B components. The silicone adhesive is mixed per the manufacturers suggested directions, in a 1:1 ratio by weight. When thoroughly blended, the mixture has a uniform gray appearance. To insure a uniform product mix, the A and B components should be thoroughly mixed prior to blending. Once components A and B are thoroughly mixed, the resultant elastomer should be de-aired. The elastomer is de-aired by conventional techniques.

In block 328 the elastomer mix is then injected into the desiccator through a glass tube and into the spaces between the stack and the inside wall of the case. The vacuum in the chamber is then released, in block 330, providing the silicone elastomer to fill any remaining voids in the stack. Thus once the vacuum is released, the elastomer fills the voids of the stack thereby enhancing the stiffness property of the stack.

The elastomer is then cured in block 332. In the preferred embodiment, a first curing step is provided at 100° C. for approximately 2 hours. At the first curing step the encapsulant sets, giving the appearance of a hard rubber material. Thereafter a second curing step is then performed at about 145°-150° C. for approximately 4 hours. The second step establishes adhesion of the silicone encapsulant to piezoelectric material. Moreover a coupling agent such as silane may be utilized to further enhance the encapsulant's adhesion characteristics.

At block 336 the axial load is then released from the stack.

Thereafter the stack is then allowed to cool for a period of 1 hour at room temperature, in block 334.

The elastomer is applied in a manner so that the electrodes and the piezoelectric discs are sufficiently covered so as to prevent arc-over. Further, the elastomer electrically isolates the stack from the housing.

In block 338 the stack is removed from the pneumatic fixture inside the vacuum chamber. The coating of the silicone encapsulant are trimmed as shown in block 340. Trimming exposes the end surfaces of the assembled stack to permit direct transfer of translational motion from the stack to a diaphragm number during actuation. Otherwise, the untrimmed end coating of elastomer would act as a compliant layer.

Block 342 represents the poling process. The poling process consists of applying a voltage signal to the stack at room temperature. For example the voltage signal is ramped-up from 0 volts to 800 volts, then ramped-down from 800 volts to 0 volts. The poling technique is conventional and is a function of the ceramic material.

As shown in the block 344, the end surface of the housing and the exposed surface of a piezoelectric disc is simultaneously ground to facilitate proper alignment of a steel diaphragm to the end of the stack housing assembly. The diaphragm may then be laser welded to the end surface of the housing as depicted at block 346. The diaphragm is preferably made of stainless steel and has a thickness of about 0.25 mm. The steel diaphragm functions to protect the stack from external contaminants. In addition, the diaphragm prevents the electrode disc stack from rotating within the housing.

Industrial Applicability

An example of the operation of the present invention will now be discussed. The main function of a piezoelectric actuator is to provide actuation. This is accomplished by applying high electrical potential to each of the piezoelectric discs. In response to receiving the electrical energy, each of the discs "grow" or expand in the axial direction, while "shrinking" or contracting in the radial direction. As each individual disc in the stack expands, the stack 130, likewise expands. Moreover, once electrical energy is removed from the discs, the discs return to their original form. This expansive feature of piezoelectric material makes the ceramic desirable for many applications requiring actuation.

As described above the silicone adhesive provides superior physical characteristics which include but is not limited to the following. The low viscosity nature of the silicone adhesive lends to good adherence to the piezoelectric discs. Moreover, the low viscosity nature allows the adhesive to fill the crevices of the stack providing for good stiffness. Thus, good stiffness property allows for greater displacement of the actuator. The alumina particles provide good thermoconductive characteristics allowing the stack to be used in a variety of applications where heat is a factor. Further the encapsulant protects the stack from external shock allowing the stack to be utilized in rugged conditions. All of the above lend to an actuator which has superior reliability.

In addition to the superior physical characteristics associated with the silicone adhesive many assembling properties are enhanced as well. The adhesive provides for primerless adhesion to the stack. Further, since only one application of adhesive is required the actuator may be produced in a speedy manner.

Other aspects, objects and advantages of the present invention can be obtained from a study of the drawings, the disclosure and the appended claims.

We claim:

1. A piezoelectric solid state motor, comprising:
   a plurality of piezoelectric elements assembled in a stack, each element having two opposing planar surfaces;
   a plurality of electrodes each having a planar section contacting the planar surfaces of two adjacent elements in said stack;
   a silicone adhesive adapted to adhere to said piezoelectric elements;
   a plurality of ceramic particles disposed in said silicone adhesive, wherein the grain size of said ceramic particles is substantially equal to the grain size of said piezoelectric elements; and
   a protective housing cylindrically encasing the combination of said stack, electrodes, and silicone adhesive.

2. A solid state motor, as set forth in claim 1, wherein the silicone adhesive is initially a low viscosity liquid and is distributed around and throughout said stack filling an area between said stack and said housing, and thereafter the silicone adhesive is cured to adhere to the piezoelectric elements.

3. A solid state motor, as set forth in claim 1, wherein each electrode includes an elongated section formed with said planar section extending outwardly from said stack.

4. A solid state motor, as set forth in claim 3, wherein:
   said piezoelectric elements and the planar sections of said electrodes have substantially circular geometries; and
   said elongated sections extend outward from the periphery of said planar sections, said elongated sections of predetermined pluralities of electrodes being fastened together.

5. A solid state motor, as set forth in claim 4, wherein the two opposing planar surfaces of the elements are formed substantially parallel to one another.

6. A solid state motor, as set forth in claim 5, wherein the elongated sections extend outward from the periphery of said planar sections at substantially right angles.

7. A solid state motor, as set forth in claim 2, wherein the composition of the ceramic particles includes alumina.

8. A solid state motor, as set forth in claim 2, wherein the grain size of the alumina particles is approximately 1 to 5 microns and the grain size of the piezoelectric elements is approximately 4 to 5 microns.

* * * * *